(12) United States Patent
Xia

(10) Patent No.: US 8,749,935 B2
(45) Date of Patent: Jun. 10, 2014

(54) PROTECTION CIRCUIT FOR LITHIUM-ION BATTERY

(75) Inventor: Huan Xia, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 81 days.

(21) Appl. No.: 13/430,699

(22) Filed: Mar. 27, 2012

(65) Prior Publication Data

US 2013/0235500 A1 Sep. 12, 2013

(30) Foreign Application Priority Data

Mar. 8, 2012 (CN) .......................... 2012 1 0059526

(51) Int. Cl.
*H02H 3/00* (2006.01)
(52) U.S. Cl.
USPC ................................ 361/88; 361/92; 320/134
(58) Field of Classification Search
None
See application file for complete search history.

(56) References Cited

U.S. PATENT DOCUMENTS

| | | | |
|---|---|---|---|
| 3,648,145 A | | 3/1972 | Meyer et al. |
| 3,719,859 A | * | 3/1973 | Frantz et al. .................... 361/92 |
| 3,851,322 A | * | 11/1974 | Compoly et al. ............. 340/530 |
| 4,567,476 A | * | 1/1986 | Lang ......................... 340/636.15 |
| 4,758,772 A | * | 7/1988 | Lang ............................. 320/136 |
| 2010/0306562 A1 | * | 12/2010 | Chen ............................. 713/323 |

FOREIGN PATENT DOCUMENTS

| | | | |
|---|---|---|---|
| DE | 1638053 | 2/1971 | |
| JP | 2008-306853 | * 12/2008 | ................ H02J 7/00 |
| WO | 2008149551 | 12/2008 | |

* cited by examiner

*Primary Examiner* — Jared Fureman
*Assistant Examiner* — Terrence Willoughby
(74) *Attorney, Agent, or Firm* — Novak Druce Connolly Bove + Quigg LLP

(57) ABSTRACT

A protection circuit for lithium-ion battery is provided. The protection circuit samples the voltage of the lithium-ion battery as a sample voltage and outputs the sample voltage. A switch circuit includes a first switch having two first connection terminals and a first control terminal. The first switch connects the two connection terminals when the control terminal receives a high logic level and disconnects the two connection terminals when the control terminal receives a low logic level. One of the first connection terminals is connected to the lithium-ion battery through a first current-limiting resistor to receive a battery voltage and is connected to an output terminal of the switch circuit, the other first connection terminal is grounded. The output terminal outputs a logic low level as a turn-on signal and a logic high level as a turn-off signal of the lithium-ion battery.

7 Claims, 1 Drawing Sheet

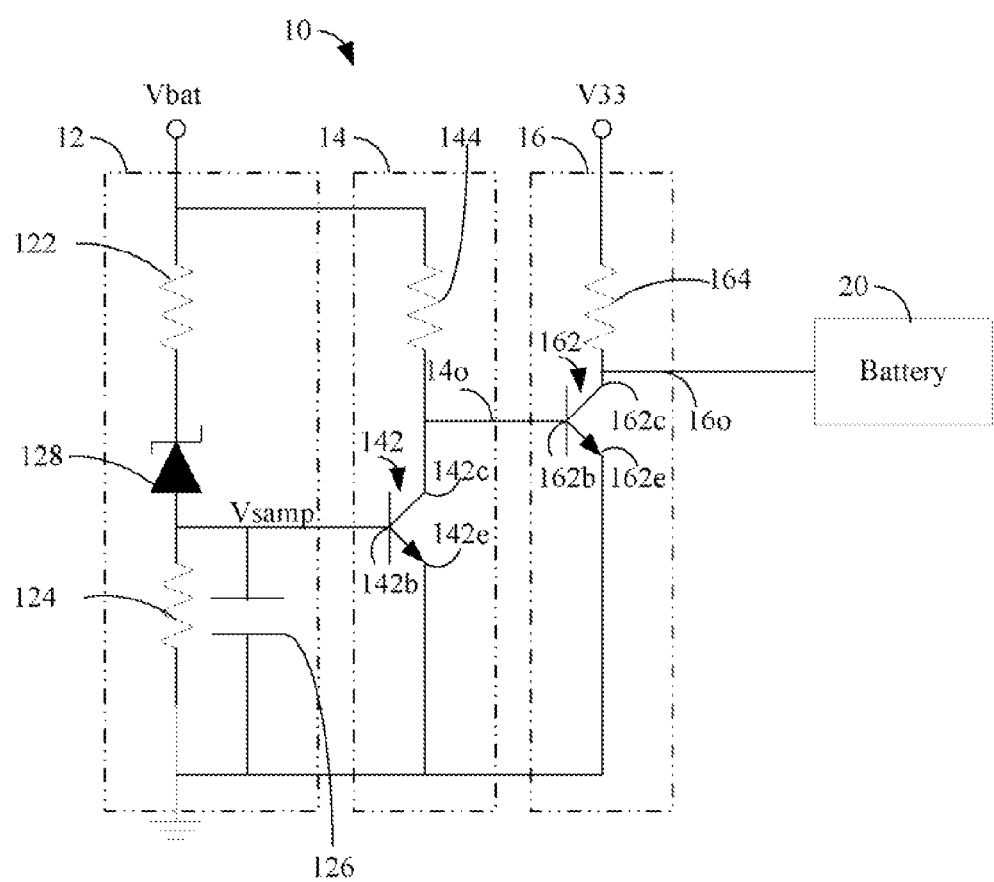

PROTECTION CIRCUIT FOR LITHIUM-ION BATTERY

BACKGROUND

1. Technical Field

The present disclosure relates to protection circuits, and more particularly, to a protection circuit for lithium-ion battery.

2. Description of Related Art

Lithium-ion batteries should not be discharged too low and therefore protection circuits are employed to detect the battery voltage and cut off the lithium batteries when the battery voltage falls to a certain voltage. A current protection circuit includes a pnp type transistor, of which the collector receives a sample voltage of the lithium-ion battery (being related to the battery voltage) and the base receives a system voltage provided by the system to which the lithium-ion battery is applied. When the sample voltage falls to a certain threshold, which indicates that the battery voltage has fallen to the cut-off voltage, the pnp type transistor will be turned off (that is, when the threshold is about 0.7V higher than the system voltage) and outputs a signal to cut off the system to protect the lithium-ion battery from being over-discharged.

However, the operation of the system itself may cause instability in the precision of the detection process and thus may adversely affect the accuracy of the detection of the cut-off voltage.

BRIEF DESCRIPTION OF THE DRAWING

Many aspects of the present embodiments can be better understood with reference to the drawing. The components in the drawings are not necessarily drawn to scale, the emphasis instead being placed upon clearly illustrating the principles of the present embodiments.

The drawing is a schematic circuit diagram of one embodiment of protection circuit in accordance with the present disclosure.

DETAILED DESCRIPTION

Embodiments of the present disclosure will be described with reference to the drawing.

Referring to the drawing, a protection circuit 10 for protecting a lithium-ion battery 20 from over-discharging includes a sample circuit 12 and a switch circuit 14.

The sample circuit 12 is configured for sampling the battery voltage Vbat of the lithium-ion battery 20 as a sample voltage Vsamp and outputting the sample voltage Vsamp.

The switch circuit 14 includes a first switch, such as a npn type transistor 142. The first switch includes two first connection terminals, such as the collector 142c and the emitter 142e of the npn type transistor 142, and a first control terminal, such as the base 142b of the npn type transistor 142. The first switch is configured for connecting the two first connection terminals when the first control terminal receives a high logic level and disconnecting the two first connection terminals when the first control terminal receives a low logic level. In particular, the collector 142c of the first npn type transistor 142 is connected to the lithium-ion battery 20 through the first current-limiting resistor 124 to receive the battery voltage Vbat, and is connected to an output terminal 14o of the switch circuit 14. The base 142b of the first npn type transistor 142 is connected to the sample circuit 12 to receive the sample voltage Vsamp and is grounded through a bypass capacitor 126. The emitter 142e of the first npn type transistor 142 is grounded. The output terminal 14o outputs a logic low (low voltage) as a turn-on signal when the first npn type transistor 142 is turned on, and outputs a logic high (high voltage) as a turn-off signal of the lithium-ion battery 20 when the first npn type transistor 142 is turned off.

The sample circuit 12 includes a first voltage-dividing resistor 122 and a second voltage-dividing resistor 124 serially connected between the lithium-ion battery 20 and the ground.

When $$Vbat * \frac{R2}{R1 + R2} > Vbe \approx 0.7 \text{ V}$$

is true, the first npn type transistor 142 is turned on, the collector 142c is pulled down to the logic low level, that is to say, the output terminal 14o outputs the turn-on signal, wherein R1, R2 are resistances of the first and second voltage-dividing resistors 122, 124, respectively, and Vbe is the voltage from the base 142b to the emitter 142e.

In contrast, when $$Vbat * \frac{R2}{R1 + R2} < Vbe \approx 0.7 \text{ V}$$

is not true, the first npn type transistor 142 is turned off, the collector 142c is pulled up to the logic high level, that is to say, the output terminal 14o outputs the turn-off signal.

As such, the stop voltage Vthre of the lithium-ion battery 20 can be determined by the equation:

$$Vthre = Vbe\left(1 + \frac{R1}{R2}\right).$$

If it is desired to set the stop voltage Vthre to 6.3V, then it can be calculated from $$6.3 \text{ V} = 0.7 \text{ V}\left(1 + \frac{R1}{R2}\right)$$

that when the resistances of the first and second voltage-dividing resistors 122, 124 satisfy $$\frac{R1}{R2} = 8,$$

the stop voltage Vthre is set to 6.3V.

By employing the protection circuit 10, the stop voltage Vthre can be accurately detected without being affected in any way by the system voltage. The lithium-ion battery 20 can be protected from being over-discharged more accurately by the protection circuit 10, as compared to protection circuits of related art.

The sample circuit 12 further includes a Zener diode 128 connected between the first and second voltage-dividing resistors 122, 124 to reduce the influences of capacitance errors of the first and second voltage-dividing resistors 122, 124 to the sample voltage Vsamp. In particular, the equation to determine the sample voltage Vsamp changes to $$(Vthre - Vd) = Vbe\left(1 + \frac{R1}{R2}\right)$$

after the Zener diode 128 is inserted, wherein Vd is the Zener voltage of the Zener diode 128. If Vd=5.1V, then to set the stop voltage Vthre at 6.3, the condition $$\frac{R1}{R2} = \frac{5}{7}$$

must be met. Then adverse influence of the capacitance errors of the first and second voltage-dividing resistors 122, 124 on the sample voltage Vsamp is reduced.

Many systems having lithium-ion batteries require the high logic level as the turn-on signal and the low logic level as the turn-off signal of the lithium-ion batteries. For this reason, the protection circuit 10 additionally includes an inverting circuit 16. The inverting circuit 16 includes a second switch, such as a npn type transistor 162. The second switch includes two second connection terminals, such as the collector 162c and the emitter 162e of the npn type transistor 162, and a second control terminal, such as the base of the npn type transistor 162. The second switch is configured for connecting the two second connection terminals when the second control terminal receives a high logic level and disconnecting the two second connection terminals when the second control terminal receives a low logic level. In particular, the base 162b of the second npn type transistor 162 is connected to the output terminal 14o, the collector 162c of the second npn type transistor 162 is connected to the lithium battery 20 to receive the battery voltage Vbat through a second current-limiting resistor 164 and functions as a control terminal 16o of the protection circuit 10. The emitter 162e of the second npn type transistor 162 is grounded. Thus, when the output terminal 14o outputs the high logic level, i.e., the turn-on signal, the second npn type transistor 162 is turned on, and the control terminal 16o outputs the logic low level as the turn-on signal to meet the requirements of one system. When the output terminal 14o outputs the logic low level, i.e., the turn-off signal, the second npn type transistor 162 is turned off, and the control terminal 16o outputs the logic high level as the turn-off signal to meet the requirements of another system.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A protection circuit for lithium-ion battery comprising:
a sample circuit to sample battery voltage of the lithium-ion battery as a sample voltage and outputting the sample voltage;
a switch circuit comprising a first switch comprising two first connection terminals and a first control terminal, the first switch being configured for connecting the two first connection terminals when the control terminal receives a high logic level and disconnecting the two first connection terminals when the control terminal receives a low logic level, wherein one of the first connection terminals is connected to the lithium-ion battery through a first current-limiting resistor to receive a battery voltage and is connected to an output terminal of the switch circuit, the other first connection terminal is grounded, and the first control terminal is connected to the sample circuit to receive the sample voltage and is grounded through a bypass capacitor, the output terminal outputs a logic low level as a turn-on signal and a logic high level as a turn-off signal of the lithium-ion battery; and
an inverting circuit, wherein the inverting circuit comprises a second switch, the second switch comprises two second connection terminals and a second control terminal, the second switch is configured for connecting the two second connection terminals when the second control terminal receives a logic high level and disconnecting the two second connection terminals when the second control terminal receives a logic low level, the second control terminal is connected to the output terminal, one of the second connection terminals is connected to the lithium battery to receive the battery voltage through a second current-limiting resistor and functions as a control terminal of the protection circuit, and the other second connection terminal is grounded; and
wherein when the output terminal outputs the high logic level, the second switch is turned on, and the control terminal outputs the logic low level as the turn-on signal of the lithium-ion battery, and when the output terminal outputs the logic low level, the second switch is turned off, and the control terminal outputs the logic high level as the turn-off signal of the lithium-ion battery.

2. The protection circuit for lithium-ion battery of claim 1, wherein the first switch comprises a npn type transistor, the first connection terminal connected to the output terminal of the switch circuit is the collector of the npn type transistor, the other first connection terminal is the emitter of the npn type transistor, and the first control terminal is the base of the npn type transistor.

3. The protection circuit for lithium-ion battery of claim 1, wherein the sample circuit further comprises a first voltage-dividing resistor and a second voltage-dividing resistor serially connected between the lithium-ion battery and the ground, when $$Vbat * \frac{R2}{R1 + R2} > Vbe \approx 0.7 \text{ V}$$

is true, the first npn type transistor is turned on, the collector is pulled down to the logic low level and outputs the turn-on signal, when $$Vbat * \frac{R2}{R1 + R2} < Vbe \approx 0.7 \text{ V}$$

is not true, the first npn type transistor is turned off, the collector is pulled up to the logic high level, and the output terminal outputs the turn-off signal, wherein R1, R2 are resistances of the first and second voltage-dividing resistors respectively, and Vbe is the voltage from the base to the emitter of the first npn type transistor.

4. The protection circuit for lithium-ion battery of claim 3, wherein the sample circuit further comprises a Zener diode connected between the first and second voltage-dividing resistors to reduce influences of the capacitance errors of the first and second voltage-dividing resistors to the sample voltage.

5. The protection circuit for lithium-ion battery of claim 3, wherein a stop voltage Vthre of the lithium-ion battery is determined by an equation:

$$Vthre = Vbe\left(1 + \frac{R1}{R2}\right),$$

if it is desired to set the stop voltage Vthre to 6.3V, it is calculated from $$6.3\,V = 0.7\,V\left(1 + \frac{R1}{R2}\right)$$

that when the resistances of the first and second voltage-dividing resistors are set to satisfy $$\frac{R1}{R2} = 8,$$

the stop voltage Vthre is set to 6.3V.

6. The protection circuit for lithium-ion battery of claim 4, wherein the equation to determine the sample voltage changes to $$(Vthre - Vd) = Vbe\left(1 + \frac{R1}{R2}\right)$$

after the Zener diode is inserted, wherein Vd is the Zener voltage of the Zener diode, if Vd=5.1V, then to set the stop voltage Vthre to 6.3, $$\frac{R1}{R2} = \frac{5}{7}$$

must be met.

7. The protection circuit for lithium-ion battery of claim 1, wherein the second switch comprises a npn type transistor, the second connection terminal functioning as the control terminal is the collector of the npn type transistor, the other second connection terminal is the emitter of the npn type transistor, and the second control terminal is the base of the npn type transistor.

\* \* \* \* \*